(12) United States Patent
Chang et al.

(10) Patent No.: US 8,121,233 B2
(45) Date of Patent: Feb. 21, 2012

(54) DRIFT CANCELLATION TECHNIQUE FOR USE IN CLOCK-FORWARDING ARCHITECTURES

(75) Inventors: Kun-Yung Chang, Los Altos, CA (US); Fariborz Assaderaghi, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/787,352

(22) Filed: May 25, 2010

(65) Prior Publication Data

US 2010/0239057 A1 Sep. 23, 2010

Related U.S. Application Data

(63) Continuation of application No. 11/468,517, filed on Aug. 30, 2006, now Pat. No. 7,724,852.

(51) Int. Cl.
*H04B 1/10* (2006.01)
(52) U.S. Cl. ........ 375/346; 375/316; 375/349; 375/354; 375/226; 375/362
(58) Field of Classification Search .................. 375/349, 375/316, 346, 354, 226, 362
See application file for complete search history.

(56) References Cited

U.S. PATENT DOCUMENTS

| | | | | |
|---|---|---|---|---|
| 5,828,870 | A * | 10/1998 | Gunadisastra | 713/503 |
| 7,233,170 | B2 * | 6/2007 | Becker et al. | 326/93 |
| 2002/0181639 | A1 * | 12/2002 | Song | 375/373 |
| 2003/0208707 | A9 | 11/2003 | Zerbe et al. | 714/715 |
| 2005/0041683 | A1 | 2/2005 | Kizer | 370/463 |
| 2005/0210308 | A1 | 9/2005 | Best et al. | 713/503 |
| 2006/0256910 | A1 | 11/2006 | Tal et al. | 375/376 |
| 2007/0285289 | A1 * | 12/2007 | Swoboda | 341/50 |

* cited by examiner

*Primary Examiner* — Kenneth Lam
(74) *Attorney, Agent, or Firm* — Morgan, Lewis & Bockius LLP

(57) ABSTRACT

A circuit includes a frequency synthesizer, N phase mixers coupled to the frequency synthesizer, a plurality of receivers, and a calibration circuit. The frequency synthesizer is to receive a reference clock signal and is to output a primary clock signal. A respective phase mixer in the N phase mixers is to output a respective secondary clock signal having a corresponding phase. A respective receiver in the plurality of receivers is coupled to two of the N phase mixers, and at a respective time is to receive data in accordance with the respective secondary clock signal from one of the two phase mixers coupled to the respective receiver. The calibration circuit is to calibrate a secondary clock signal output by a respective phase mixer in the N phase mixers by adjusting the phase of the secondary clock signal of the respective phase mixer.

19 Claims, 10 Drawing Sheets

DRIFT CANCELLATION TECHNIQUE FOR USE IN CLOCK-FORWARDING ARCHITECTURES

RELATED APPLICATIONS

This application is a continuation of U.S. patent application Ser. No. 11/468,517, filed Aug. 30, 2006, now U.S. Pat. No. 7,724,852, which is incorporated by reference herein in its entirety.

FIELD

The subject matter disclosed herein relates generally to circuits for use in integrated circuits, and in particular, to circuits and associated methods for canceling drift in devices that include a clock-forwarding architecture.

BACKGROUND

Many communication systems include devices that transmit and/or receive signals synchronously, i.e., in accordance with one or more clock signals. In some systems, the one or more clock signals may be generated based on data patterns that correspond to the signals. In other systems, the one or more clock signals may be provided to devices or communicated between devices. For example, an external clock signal may be provided or a clock signal may be communicated over a link that couples a transmitting device and a receiving device.

The devices in these communication systems may include frequency synthesizer circuitry to generate or modify the one or more clock signals. For example, the frequency synthesizer circuitry may select or adjust a phase or a frequency of the one or more clock signals that are provided to the devices. The output clock signals from this frequency synthesizer are then coupled to additional circuitry, such as transmit or receive circuits, in the devices. This approach is referred to as a clock-forwarding architecture.

Unfortunately, many systems and devices that include a clock-forwarding architecture are sensitive to timing drift effects, such as those associated with path-length differences, as well as process, voltage and/or temperature variations. For example, timing drifts may occur at a variety of locations in a respective device, including in the frequency synthesizer (such as in a phase-frequency detector or a charge pump), over signal lines and wires that couple the additional circuitry to the frequency synthesizer (such as clock-path mismatch, which gives rise to clock skew), and/or in the additional circuitry (such as in sample and hold circuits in a receiver). Timing drift may cause timing offset between clock and data. If this timing offset is not corrected, system or device performance (such as a bit-error rate) may be degraded.

In some existing systems and devices, open-loop circuit matching of a path length and/or one or more components are used to reduce or eliminate timing drift. However, this approach is limited by an accuracy of the matching. In more advanced processes, this matching may be difficult to achieve, or it may be realized at a prohibitive power and area penalty.

Closed-loop or continuous time timing drift cancellation techniques often offer better performance than open-loop matching. These approaches may be able to eliminate or significantly reduce timing drift. However, existing closed-loop techniques often incur significant increases in power consumption and overhead (such as significant circuit redundancy in the frequency synthesizer for each transmit or receiver circuit). The existing closed-loop techniques may also need a minimum transition density in the data that is communicated. If this is achieved using coding there may be a reduction in an efficiency of the link. And if a periodic timing calibration technique is used, there will be data interrupts that may not be acceptable in certain applications.

There is a need, therefore, for improved timing drift cancellation circuits and techniques that reduce and/or eliminating timing drift without the aforementioned problems.

BRIEF DESCRIPTION OF THE DRAWINGS

For a better understanding, reference should be made to the following detailed description taken in conjunction with the accompanying drawings, in which.

Like reference numerals refer to corresponding parts throughout the drawings.

DETAILED DESCRIPTION OF EMBODIMENTS

Figure 1:
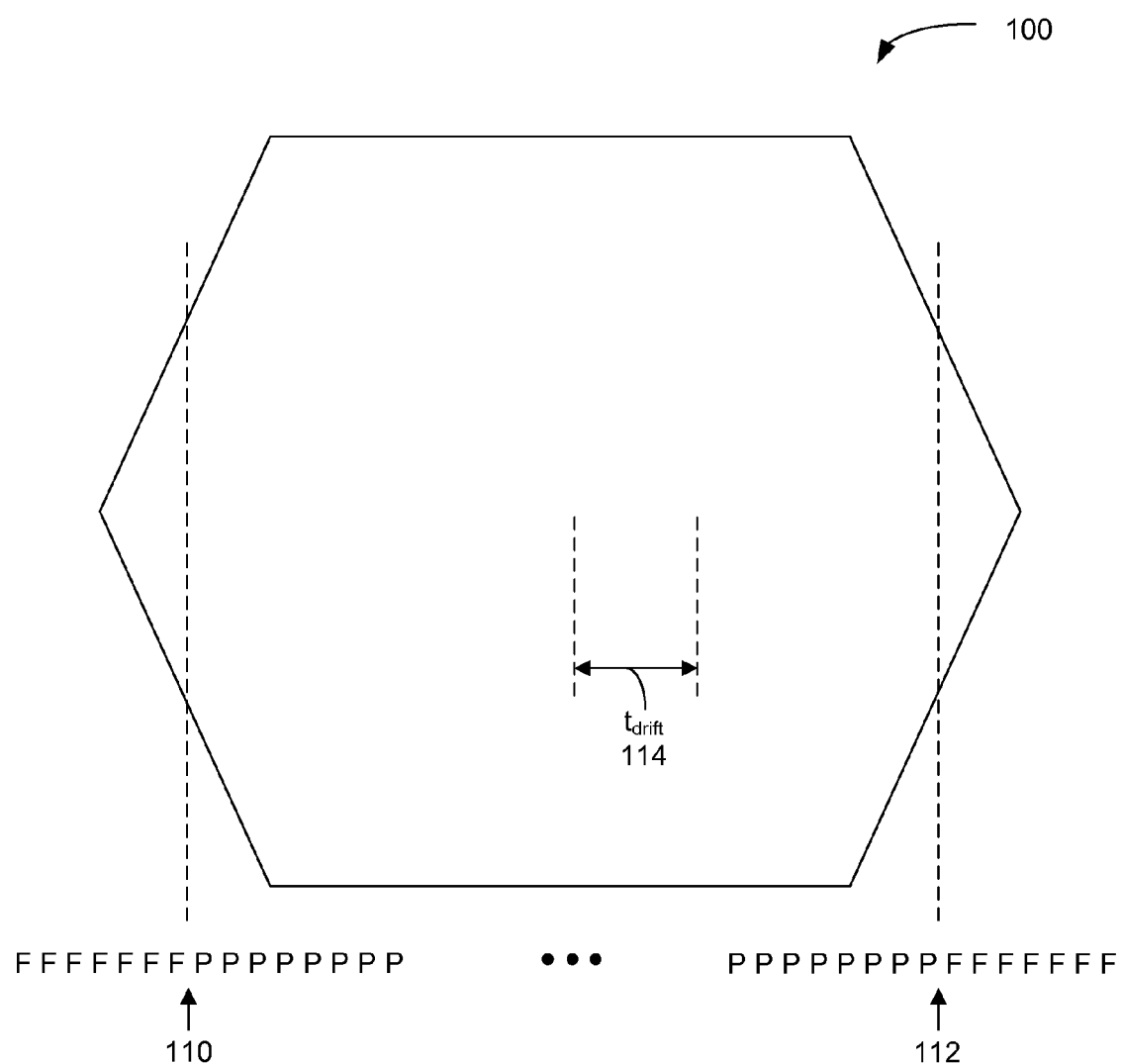
FIG. 1 schematically illustrates an eye pattern.

Embodiments of a circuit are described. In one embodiment, the circuit includes N phase mixers to receive a primary clock signal, where a respective phase mixer in the N phase mixers is to output a respective secondary clock signal having a corresponding phase. The circuit also includes a plurality of M receivers, where M is smaller than N. The M receivers are to receive data in accordance with respective secondary clock signals from respective ones of a first group of M phase mixers in the N phase mixers in a first time period, and are to receive data in accordance with respective secondary clock signals from respective ones of a second group of M phase mixers in the N phase mixers in a second time period. The second group of M phase mixers has at least one first phase mixer that is not in the first group of M phase mixers, and the first group of M phase mixers has at least one second phase mixer that is not in the second group of phase mixers. A calibration circuit in the circuit is to calibrate a secondary clock signal output by the at least one first phase mixer in the first time period and is to calibrate the secondary clock signal output by the at least one second phase mixer in the second time period. In some embodiments, M equals N−1.

In some embodiments, the circuit further includes coupling circuitry to selectively couple a respective phase mixer of the N phase mixers, at distinct times, to a first respective receiver in the plurality of M receivers, a second respective receiver in the plurality of receivers, and the calibration circuit.

In some embodiments, the respective phase mixer of the N phase mixers includes circuitry for generating a respective secondary clock in accordance with a first phase when the respective phase mixer is coupled to the first respective receiver and for generating the respective secondary clock in accordance with a second phase when the respective phase mixer is coupled to a second respective receiver. The calibration circuit is to adjust the first phase and the second phase when the respective phase mixer is coupled to the calibration circuit.

In some embodiments, the circuit further includes control logic, where the control logic is to select a coupling configuration for the secondary clock signals output by the N phase mixers, the plurality of M receivers and the calibration circuit.

In some embodiments, the calibration circuit is to adjust the phase of the secondary clock of a selected phase mixer to account for clock drift during operation of the circuit.

A respective receiver in the M receivers may be associated with two phase mixers in the N phase mixers. In some embodiments, a respective receiver in the M receivers includes first and second receiver units coupled to respective ones of first and second phase mixers in the N phase mixers. The first and second receiver units are to sample data according to respective secondary clock signals from respective ones of the first and second phase mixers. The calibration circuit is to adjust the phase of the secondary clock from one of the first and second phase mixers in accordance with data output from the first and second receiver units.

In some embodiments, the circuit further includes a frequency synthesizer to receive a reference clock signal and to output the primary clock signal based on the reference clock signal, and an additional phase mixer coupled to the frequency synthesizer, where the additional phase mixer is to provide a feedback reference signal.

In another embodiment, a method of calibrating clock signals for timing drift is described. In the method, data is received in accordance with respective clock signals from respective ones of a first group of M phase mixers in N phase mixers during a first time period, and data is received in accordance with respective clock signals from respective ones of a second group of M phase mixers in the N phase mixers during a second time period. The second group of M phase mixers has at least one first phase mixer that is not in the first group of M phase mixers, and the first group of M phase mixers has at least one second phase mixer that is not in the second group of M phase mixers. The method further includes calibrating the at least one first phase mixer during the first time period, and calibrating the at least one second phase mixer during the second time period.

Reference will now be made in detail to embodiments, examples of which are illustrated in the accompanying drawings. In the following detailed description, numerous specific details are set forth in order to provide a thorough understanding of the subject matter presented herein. However, it will be apparent to one of ordinary skill in the art that the subject matter may be practiced without these specific details. In other instances, well-known methods, procedures, components, and circuits have not been described in detail so as not to unnecessarily obscure aspects of the embodiments.

A circuit that implements closed-loop or continuous clock data recovery is described. The circuit may be included in an integrated circuit, and may reduce and/or eliminate timing drift on a pin-by-pin or bit-by-bit basis (in devices that include a multiple bit interface). The continuous clock data recovery utilizes limited or minimum circuit overhead, and may avoid modifications to data coding (i.e., reductions in link efficiency) and/or interrupts in data communication. This continuous clock data recovery approach utilizes one or more additional phase mixers in a set of phase mixers that are coupled to corresponding receivers in a set of receivers.

In an exemplary embodiment, there are N phase mixers and N−1 receivers. A respective receiver is coupled to two of the N phase mixers, and at a given time the respective receiver receives data in accordance with a clock signal from one of these two phase mixers. One phase mixer in the set of phase mixers is coupled to a calibration circuit by control logic, where one or more timing offset values for at least one clock signal output by the one phase mixer are determined. The one or more timing offset values may correspond to a phase of the clock signal, and may be used to set a sampling time corresponding to the clock signal at approximately the center of an eye pattern thereby reducing and/or eliminating timing drift. During a time interval, all of the clock signals that are output from the phase mixers to the receivers may be calibrated by coupling the clock signals to the calibration circuit in a round-robin fashion. Thus, each of the clock signals is coupled to the calibration circuit during different subintervals in the time interval.

In some embodiments, the calibration of the clock signals uses pairs of receivers, where one of the receivers receives data in accordance with a first calibrated clock signal and the other receiver receives data in accordance with a second clock signal that is to be calibrated. In this approach, the calibration of the second clock signal may be in accordance with the data received by the two receivers.

The circuit may be a memory controller and/or a memory device. The memory device may include a memory core that utilizes solid-state memory, semiconductor memory, organic memory and/or another memory material, including volatile and/or non-volatile memory. The memory device may include dynamic random access memory (DRAM), static random access memory (SRAM) and/or electrically erasable programmable read-only memory (EEPROM). The circuit may be included in one or more components in a memory system, such as a memory controller and/or one or more memory devices. The one or more memory devices may be embedded in one or more memory modules. The memory controller and the one or more memory devices may be on a common or same circuit board. The circuit may be included in one or more components in other systems, such as those that include logic chips, including a serializer/deserializer, PCI Express and/or other high-speed interfaces or input/output links.

FIG. 1 provides a schematic of an eye diagram or eye pattern 100 associated with a data signal. The eye diagram 100 indicates an acceptable range of timing values that is defined by pass (P) and fail (F) boundaries 110 and 112. A timing drift $t_{drift}$ 114 is shown with respect to the center of the eye diagram 100. In a 5 Gb/s link that has a 200 ps bit time, $t_{drift}$ 114 of 20 ps will reduce the timing margin by 40 ps (twice $t_{drift}$ 114). In one embodiment of the circuit, the clock signal used by a respective receiver to receive a data signal is calibrated to be near a center of the eye diagram associated with the data signal.

Figure 2:
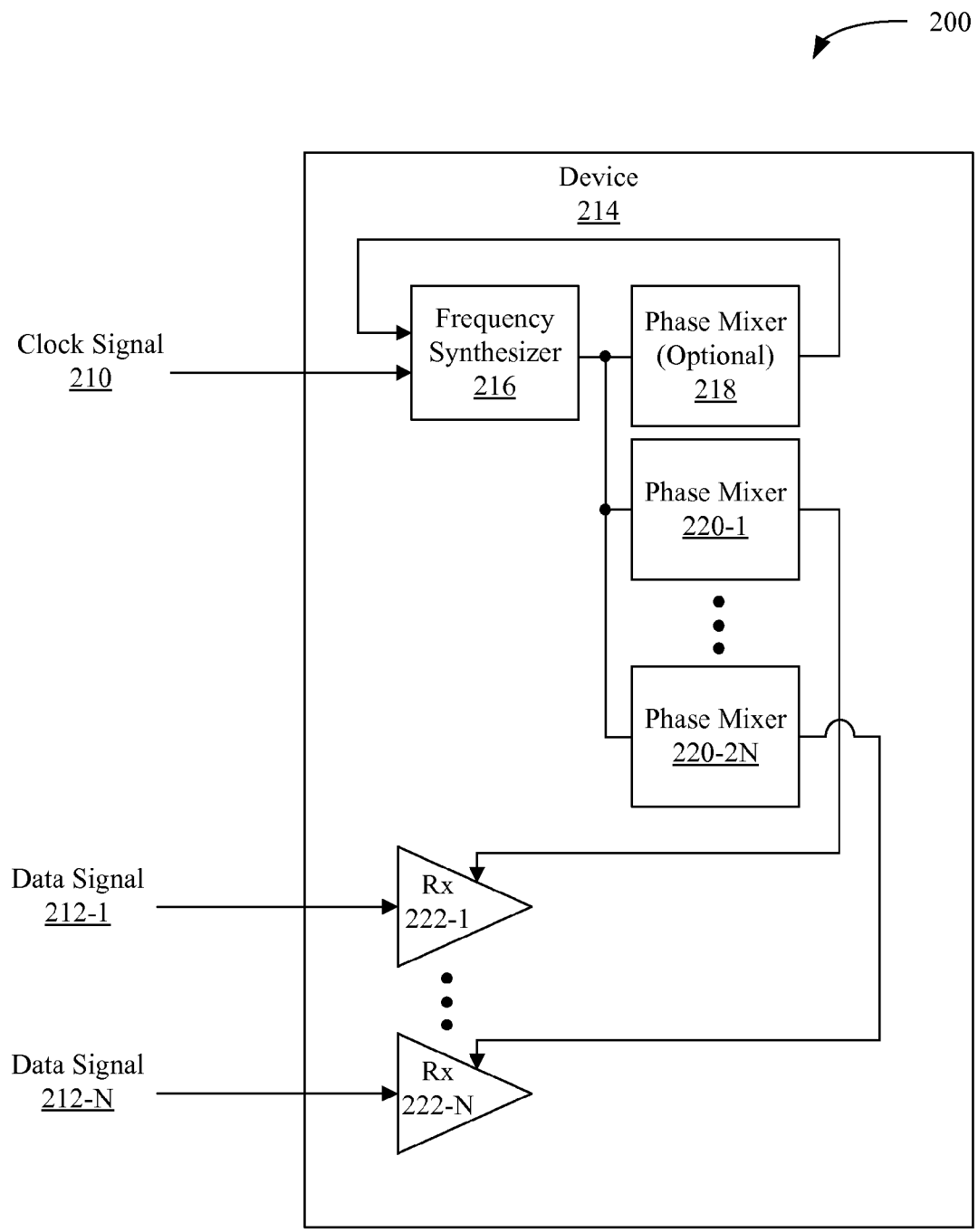
FIG. 2 is a block diagram illustrating an embodiment of a device.

Attention is now directed towards embodiments that address the difficulties associated with existing approaches for clock data recovery. FIG. 2 is a block diagram illustrating an embodiment 200 of a device 214. Device 214 includes receivers 222-1 through 222-N to receive respective data signals 212-1 through 212-N, and a frequency synthesizer 216 to receive a reference clock signal 210. Reference clock signal 210 may be forwarded from another device or locally generated. The frequency synthesizer 216, which may include a phase locked loop (PLL) and/or a delay locked loop (DLL), outputs one or more primary clock signals that correspond to the reference clock signal 210. The one or more primary clock signals may have different phases and/or frequencies than the reference clock signal 210. In an exemplary embodiment, the primary clock signals include a set of phasor signals that are offset in phase from each other by an integer multiple of a predetermined phase difference. For example, the primary clock signals may include eight phasor signals and the predetermined phase difference may be approximately 45 degrees (i.e., approximately one eighth of 360 degrees).

The primary clock signals are coupled to 2N phase mixers 220. The phase mixers 220 each generate a secondary clock signal in accordance with one or more of the primary clock signals, for example, by interpolating between two respective phasors. The secondary clock signals may be calibrated during an initialization or start-up procedure, such as when the device 214 is first powered on. The calibration adjusts and/or determines a phase of a respective secondary clock signal such that sampling times corresponding to the secondary clock signal are centered within an eye pattern, such as the eye pattern 100 (FIG. 1). For example, one or more offset values for each secondary clock signal may be determined. These initial offset values may be used by corresponding phase mixers 220 when generating the secondary clock signals. In addition, an optional phase mixer 218 may provide a feedback reference clock signal to the frequency synthesizer 216 to assist the frequency synthesizer 216 in maintaining a frequency and/or a phase lock. This feedback mechanism may not be necessary, however, since the phase mixers 220 may be calibrated for the timing drifts in the device 214.

The 2N phase mixers may be coupled to a set of N receivers 222. In an exemplary embodiment, two of the phase mixers 220 are coupled to a corresponding one of the receivers 222. The receivers 222 receive data signals 212 in accordance with the secondary clock signals output by corresponding phase mixers 220. For example, at a given time, a sampling time of a respective receiver (such as receiver 222-1) may correspond to a secondary clock signal from a first of the two phase mixers 220 that are coupled to the respective receiver. Simultaneously, a secondary clock signal from a second of the two phase mixers 220 that are coupled to the respective receiver may be calibrated for timing drift. At a later time, after the calibration of the first phase mixer is completed, the sampling time of the respective receiver may correspond to the secondary clock signal from the second mixer and the secondary clock signal from the first mixer may be calibrated for timing drift.

In this way, the clock data recovery approach illustrated in the embodiment 200 may reduce and/or eliminate timing drift that occurs after the initial calibration of the device 214 (such as timing drifts that occur during operation) thereby maintaining the communication channel error margin. However, this approach may entail considerable overhead (such as a doubling of the number of phase mixers 220) with a commensurate increase in circuit area and power consumption.

Figure 3:
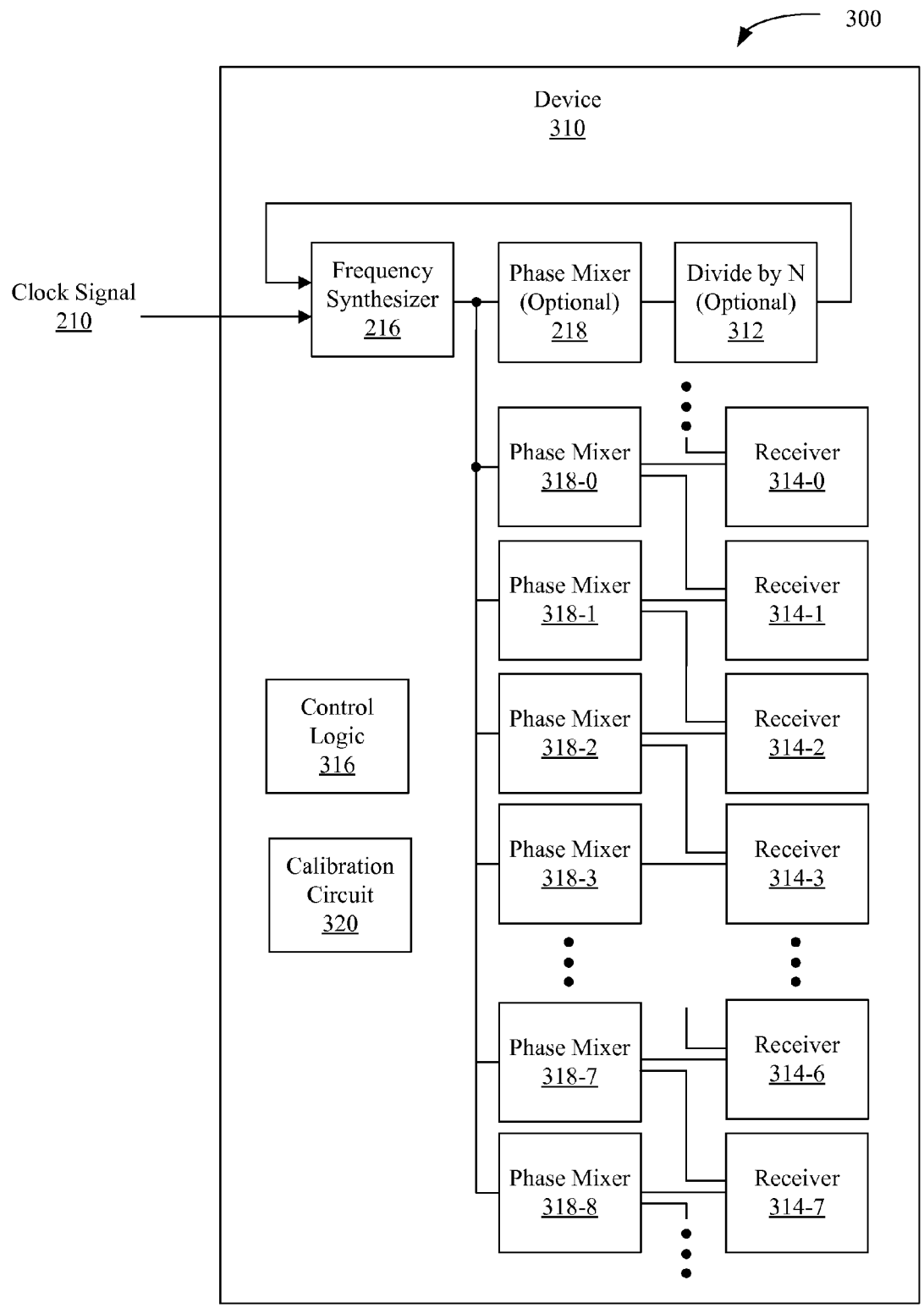
FIG. 3 is a block diagram illustrating an embodiment of a device.

FIG. 3 is a block diagram illustrating an embodiment 300 of a device 310 that includes the ability to recalibrate the secondary clock signals while significantly reducing the associated overhead. Device 310 includes a set of N phase mixers 318 and a set of N−1 receivers 314. In an exemplary embodiment, there are 9 phase mixers 318 and 8 receivers 314 (corresponding to a data byte that is communicated over an interface). In the exemplary embodiment, the reference clock signal 210 may have a frequency of 500 MHz and the primary clock signals (the set of phasors) output by the frequency synthesizer 216 may have a frequency of 2.5 GHz.

In one embodiment, at a given time a respective receiver 314 is to receive data in accordance with a secondary clock signal from one of two phase mixers 318. The secondary clock signal from another one of the two phase mixers 318 may be coupled to a calibration circuit 320 or to another receiver 314. The calibration circuit 320 may determine one or more clock signal timing offset values and/or one or more receiver circuit voltage offset values. The timing offset values may correspond to a phase of the one of the secondary clock signals and may center sampling times corresponding to the secondary clock signal at the center of an eye pattern. The phase mixers 318 are discussed further below with reference to FIG. 4.

The secondary clock signals coupled to the corresponding receivers 314 may be changed, and therefore each of the secondary clock signals may be calibrated from time to time. For example, the secondary clock signals may be coupled to the calibration circuit 320 in a round-robin fashion so that the secondary clock signals are calibrated one by one in successive time intervals. Thus, calibration of the secondary clock signals may be performed on the fly, i.e., without interrupting data communication. In an exemplary embodiment, each time interval may be between 1 μs and 1 ms.

In some embodiments, the configuration of phase mixers 318 providing secondary clock signals to the receivers 314 may be in accordance with control signals from control logic 316. For example, the secondary clock signals may be selectively coupled to the receivers 314 using one or more multiplexers. Embodiments of circuits and related methods for calibrating the secondary clock signals are discussed further below with reference to FIGS. 5-8.

Note that while the embodiment 200 (FIG. 2) and the embodiment 300 focus on reduction and/or elimination of timing drift in receivers 222 (FIG. 2) and 314, timing drift in transmitters (elsewhere in a system) may be, at least in part, addressed by including a transmit clock in a feedback loop, such as a feedback loop that includes a PLL. This transmit clock may be shared by more than one transmitter. Residual timing drift or clock skew in the transmitter may be associated with a phase-frequency detector and/or a charge pump in the PLL. This residual timing drift may be reduced and/or eliminated in the receiver, as discussed further below with reference to FIGS. 6 and 8.

In some embodiments, the device 310 may include fewer or additional components. For example, in some embodiments the device 310 may include an optional divide-by-N component 312, such as a divide-by-5 component, in the feedback loop for the frequency synthesizer 216. Logical positions of one or more components in the device 310 may be changed, and two or more of the components may be combined and/or shared.

Figure 4:
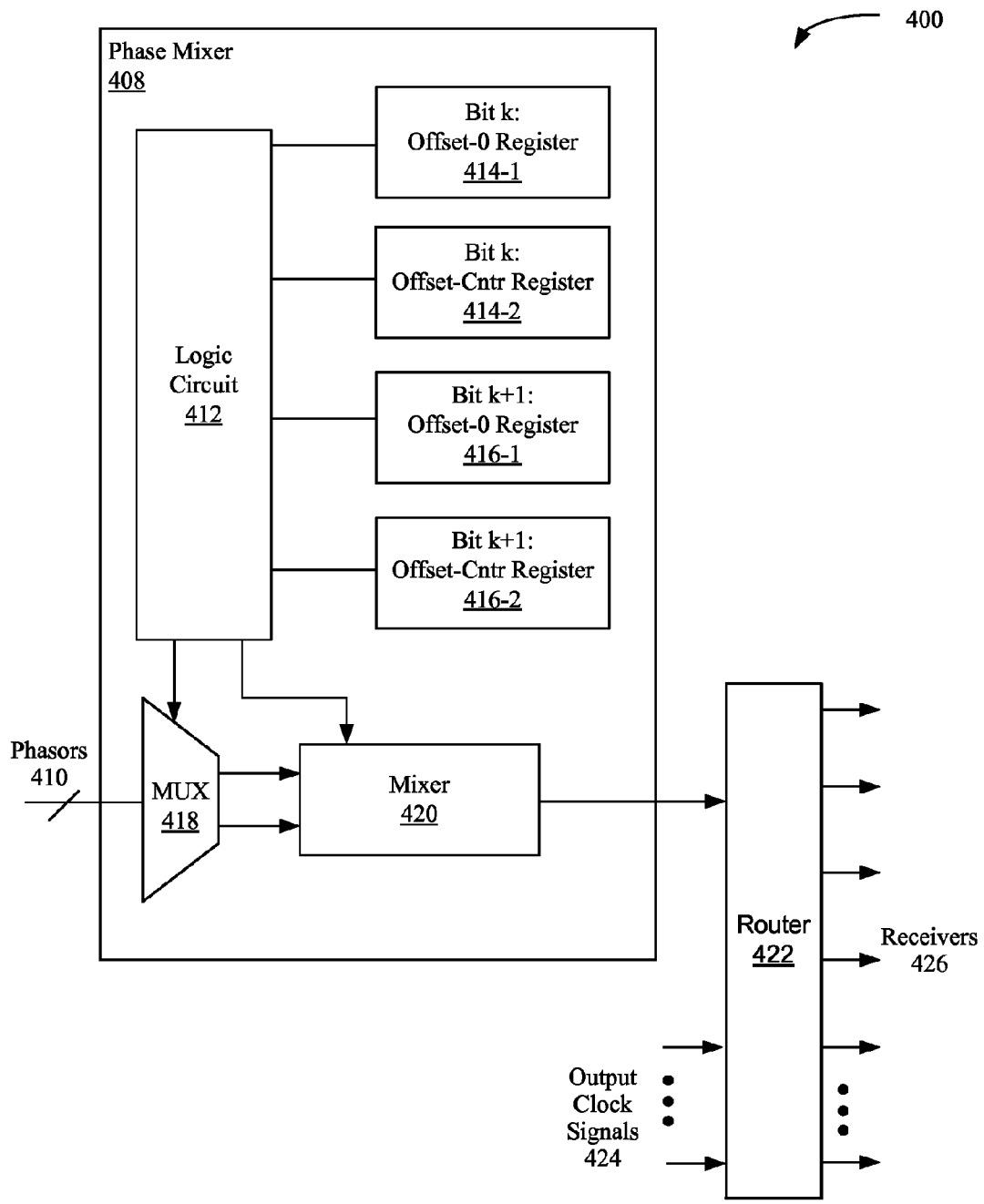
FIG. 4 is a block diagram illustrating an embodiment of a phase mixer.

FIG. 4 is a block diagram illustrating an embodiment 400 of a phase mixer 408, such as one of the phase mixers 318 (FIG. 3). The phase mixer 408 may receive primary clock signals, such as a set of phasors 410, from the frequency synthesizer 216 (FIG. 3). A selective coupler, such as multiplexer 418, may couple a respective pair of phasors to a mixer 420 in accordance with a phase value or command from control logic 412. The mixer 420 may generate a secondary clock signal by interpolating between the respective pair of phasors in accordance with the phase value or command from the control logic 412. In some embodiments, therefore, the secondary clock signal may correspond to one or more of the phasors.

The secondary clock signal, as well as secondary clock signals 424 from other phase mixers, may be coupled to corresponding receivers 426 using a router 422. As described further below with reference to FIGS. 5 and 6, in some embodiments, however, multiplexers may be used in addition to or in place of the router 422. In some embodiments, the router 422 or the multiplexers are not used and a respective receiver is coupled to two of the phase mixers. In these embodiments, the respective receiver includes selection circuitry controlled by control logic 316 to select a secondary clock signal from one of the two phase mixers, or to select a data sample obtained according to one of the secondary clock signals from the two phase mixers, as discussed below.

Selective coupling by the multiplexer 418 may be in accordance with control signals from control logic 316 (FIG. 3) and interpolation in the mixer 420 may be in accordance with one or more offset values stored in registers 414 and 416. For example, at a given time the phase mixer 408 may provide one of the secondary clock signals to a respective receiver, such as a first receiver that corresponds to a bit k in a byte. A phase of the secondary clock signal may be determined and/or selected in accordance with registers 414. In particular, register 414-1 may include an offset value (offset 0) that is determined during initialization of the device 310 (FIG. 3), for example, when the device 310 is first powered on. Register 414-2 may include an offset value (offset cntr) that is updated during recalibration of the secondary clock signal for the first receiver.

In one embodiment, the secondary clock signal from the phase mixer 408 is provided to two of the receivers 314, as shown in FIG. 3. For example, the secondary clock signal may also be provided to a second receiver that corresponds to bit k+1 in the byte. In some embodiments, the phase mixer 408 may include two mixers 420 to output two secondary clock signals, including one for the receiver corresponding to bit k and another fore the receiver corresponding to bit k+1. Alternatively, at certain times during the time interval, one of the two secondary clock signals may be coupled to the calibration logic 320 (FIG. 3) for recalibration. The calibration logic 320 (FIG. 3) may determine an update to an offset value, such as the offset value stored in offset-cntr register 416-2.

In some embodiments, the phase mixer 408 may include fewer or additional components. Logical positions of one or more components in the phase mixer 408 may be changed, and two or more of the components may be combined and/or shared. Also, two or more phase mixers may be combined into one phase mixer to output two or more independent secondary clock signals.

Figure 5:
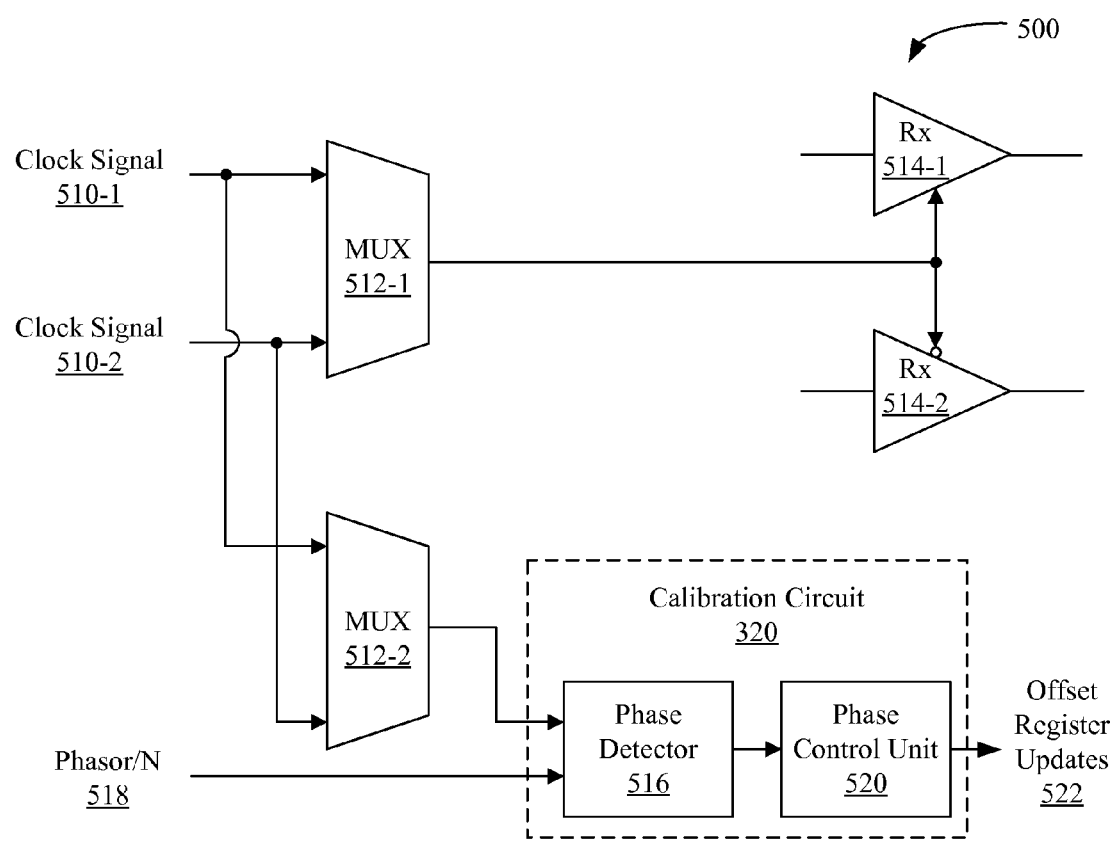
FIG. 5 is a block diagram illustrating an embodiment of a receiver.

FIG. 5 is a block diagram illustrating an embodiment 500 of a receiver, such as one of the receivers 314 (FIG. 3). Secondary clock signals 510 from two phase mixers 314 (FIG. 3) may be selectively coupled using multiplexers 512 to receiver circuits 514 and the calibration circuit 320. Receiver circuits 514 may receive data at sample times that correspond to one or both edges in a respective secondary clock signal that is coupled to the receiver circuits 514. Thus, in some embodiments, the receiver circuits 514 have a dual data rate mode of operation.

The calibration circuit 320 may include a phase detector 516 and a phase control unit 520. The phase detector 516 may determine a phase difference between a respective secondary clock signal that is coupled to the phase detector 516 and a reference clock signal, such as a phasor/N signal 518. The phasor/N signal 518 may correspond to an output from the optional divide-by-N component 312 (FIG. 3). An output from the phase detector 516 may be coupled to the phase control unit 520, which may output one or more updates 522 to update offset values for one or more offset registers (such as registers 414-2 and 416-2 in FIG. 4).

At a later time, the respective secondary clock signals coupled to the receiver circuits 514 and the calibration logic 320 may be changed, thereby allowing another secondary clock signal to be recalibrated. In some embodiments, embodiment 500 may include fewer or additional components, logical positions of one or more components may be changed, and two or more of the components may be combined and/or shared.

Figure 6A:
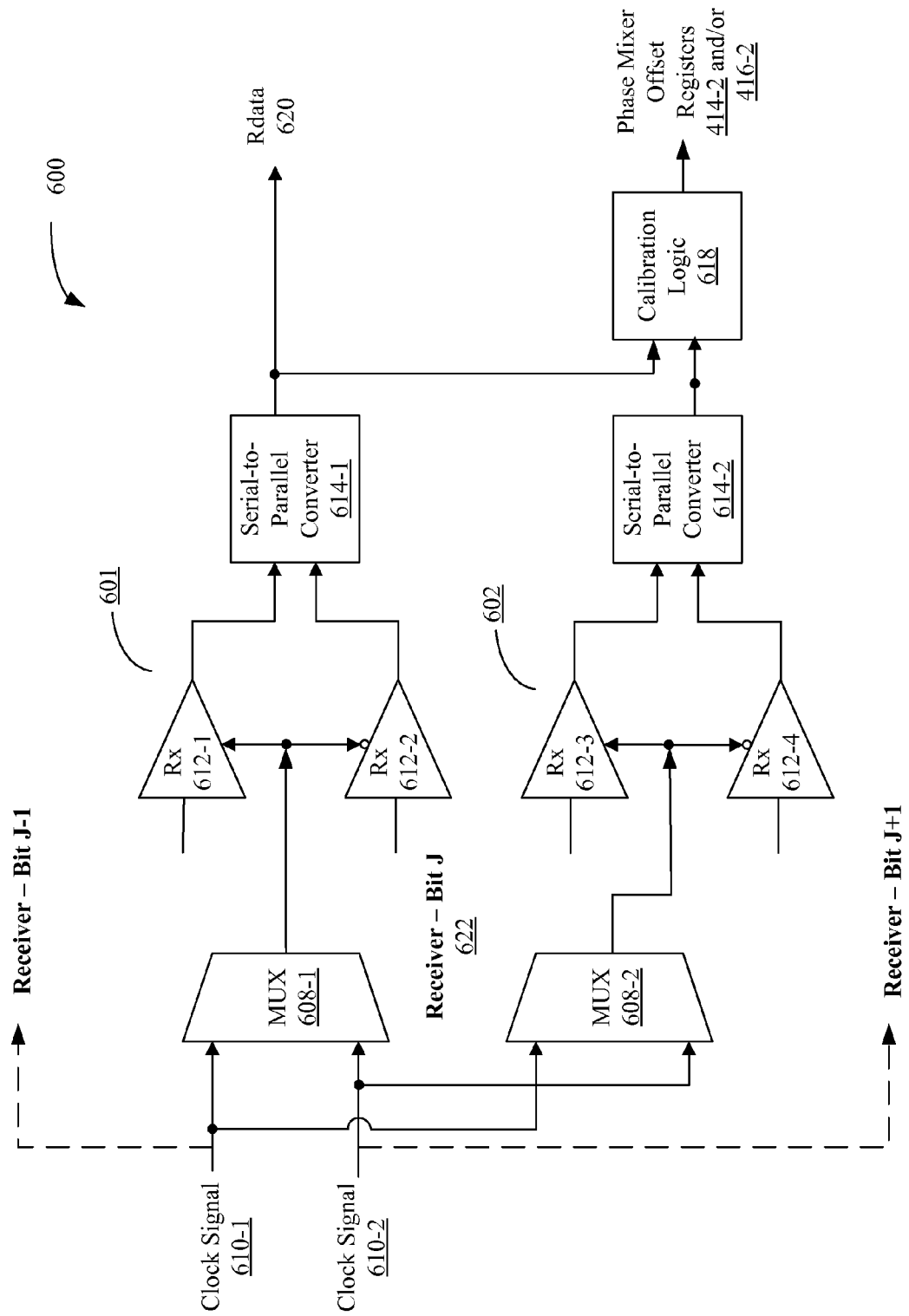
FIG. 6A is a block diagram illustrating an embodiment of a receiver.

In the receiver embodiment 600 shown in FIG. 6A, the receiver includes first and second receiver units 601 and 602, one of which, such as receiver unit 601 is to output received data "Rdata". Each receiver unit 601 or 602 includes at least one receiver circuit 612. For example, receiver unit 601 includes receiver circuits 612-1 and 612-2, and receiver unit 602 includes receiver circuits 612-3 and 612-4. Secondary clock signals 610 from two phase mixers 314 (FIG. 3) may be selectively coupled using multiplexers 608 to receiver unit 601 and receiver unit 602. Each receiver unit 601 or 602 may receive data at sample times that correspond to one or both edges in a respective secondary clock signal 610 that is coupled to that receiver unit. In addition, in some embodiments receiver units 601 and 602 are multi-bit or multi-symbol receivers (i.e., receivers that receive signals representing more than one bit per sample time), while in other embodiments the receiver units 601 and 602 are single-bit or single-symbol receivers (receivers that receive signals representing a single bit or symbol per sample time). As in embodiment 500, a respective secondary clock signal is coupled to two receivers of two different bit streams. For example, secondary clock signal 610-1 is coupled to the receiver for bit or symbol J−1 and to the receiver 622 for bit or symbol J. Similarly, secondary clock signal 610-2 is coupled to the receiver 622 for bit J and to the receiver for bit or symbol J+1. The receiver for bit or symbol J−1 or J+1 may be similarly configured as receiver 622 for bit or symbol J and thus also includes first and second receiver units. Therefore, in embodiment 600, there may be twice as many receivers 612 as needed for each data bit or symbol stream.

Data output by the receiver circuits 612 may be converted from serial to parallel format in serial-to-parallel converters 614. For example, serial data input to the serial-to-parallel converters 614 may correspond to 2.5 GHz data streams and the parallel data output may correspond to ten parallel 250 MHz data streams. The data may be coupled to calibration logic 618 (discussed further below).

While FIG. 6A shows receiver circuitry 622-1 for only one bit or symbol stream (e.g., 1-bit, 2-bit, 3-bit or 4-bit symbols transmitted using 2-PAM, 4-PAM, 8-PAM or 16-PAM signals), a complete system may have additional instances of the receiver circuitry 622 for each additional bit or symbol that is received in parallel by the system or circuit. Each of those receiver circuits 620 outputs data to the calibration logic 618.

The respective secondary clock signal, such as the secondary clock signal 610-1, that is coupled to the receivers 612-1 and 612-2 may already be calibrated. For example, this secondary clock signal may have been previously calibrated using the approach illustrated in embodiment 500 (FIG. 5) and/or embodiment 600. Thus, first data received by the receiver circuits 612-1 and 612-2 may be reliable or trusted data, i.e., data that is deemed correct.

This trusted first data may be used to calibrate another respective secondary clock signal, such as the secondary clock signal 610-2, that is coupled to the receiver circuits 612-3 and 612-4. For example, second data received by the receiver circuits 612-1 and 612-4 may be compared to the trusted first data in the calibration logic 618. In an exemplary embodiment, the comparison includes an XOR operation. A phase of the secondary clock signal 610-2 that is being calibrated may be systematically swept over the corresponding eye pattern, such as the eye pattern 100 (FIG. 1), in order to determine pass-fail boundaries, such as the pass-fail boundaries 110 and 112 (FIG. 1). In this way, sampling times corresponding to the secondary clock signal 610-2 may be centered in the eye pattern and the channel error margin may be increased and/or maximized. Techniques such as flex phase and schmooing may be utilized in this process. Upon completion of the calibration or recalibration, updates to offset register 414-2 and/or 416-2 (FIG. 4) may be provided to one or more of the phase mixers 318 (FIG. 3). In addition, a voltage offset of a respective receiver circuit 612 (e.g., 612-1) in a receiver unit 601 or 602 (of a receiver 622) may be systematically swept over the corresponding eye pattern in order to determine pass-fail boundaries, and to then select a center or best voltage offset for the respective receiver circuit 612. In some embodiments, the resulting selected voltage offset is stored as a digital value in a register of the receiver unit 601 or 602, or elsewhere in the receiver 600, while in other embodiments the resulting selected voltage offset is stored as an analog signal. The voltage offset calibration process can be performed for all the receiver circuits 612 of a respective receiver 622. It is noted that receiver 600 recalibrates the voltage offsets of a respective receiver circuit 612 in a respective receiver unit 601 or 602 by comparing the data produced by the respective receiver circuit 612 with the reliable or trusted data produced by the other receiver unit 602 or 601 in the same receiver 622.

At a later time, the respective secondary clock signals coupled to the receiver units 601 and 602 may be changed, thereby allowing the secondary clock signal 610-1 to be recalibrated. During recalibration of secondary clock signal 610-1, the other secondary clock signal 610-2 (which has already been recalibrated) is used to obtain reliable or trusted data that are used to calibrate the secondary clock signal 610-1.

In some embodiments, the secondary clock signal 610-2 may be coupled to an additional receiver circuit 622 along with yet another secondary clock signal 610-x. Each of these secondary clock signals is used during a respective time period to obtain reliable or trusted data that are used to calibrate the other secondary clock signal.

Figure 6B:
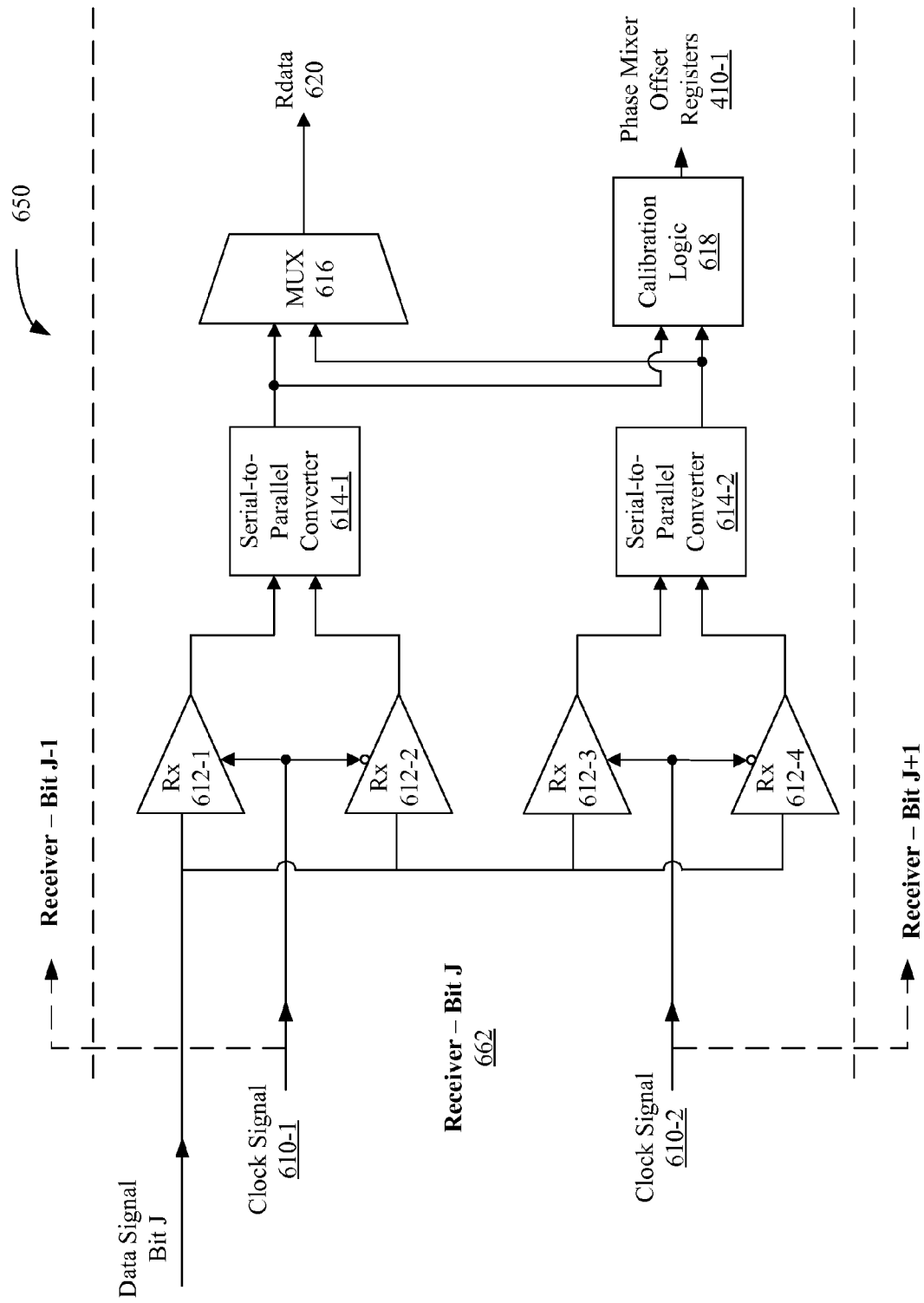
FIG. 6B is a block diagram illustrating an embodiment of a receiver.

FIG. 6B is a block diagram illustrating an embodiment 650 of a receiver 662, such as one of the receivers 314 (FIG. 3) Embodiment 650 is similar to embodiment 600 except that multiplexers 608 are removed and multiplexer 616 is added to select one of serial-to-parallel converters 614 to output Rdata. As a result, only one multiplexer 616 is required, and secondary clock signals 610-1 and 610-2 can be directly coupled to respective ones of the receiver units 601 and 602. As in the embodiment 600, there are twice as many receiver units 601 and 602 as needed for each data bit or symbol stream, and a respective secondary clock signal is coupled to two receivers, which receive of two different bit streams. For example, secondary clock signal 610-1 is coupled to two receivers 622, one for receiving bit or symbol J, and another for receiving bit or symbol J−1. Similarly, secondary clock signal 610-2 is coupled to two receivers 622, one for receiving bit or symbol J and another for receiving bit or symbol J+1.

While the approach illustrated in FIGS. 6A and 6B may entail additional overhead, these approaches offer the advantage of correcting for timing drift and/or voltage offsets in both a transmitter and a receiver, i.e., in the entire communication channel. In some embodiments, a minimum transition density in the first and second data may be necessary in order to use the approach illustrated in embodiments 600 and/or 650. This may be achieved by scrambling and/or encoding the first and second data. In other embodiments, however, the approaches illustrated in FIG. 5, and the approaches illustrated in FIGS. 6A and 6B may both be utilized. For example, the approach illustrated in FIG. 5 may be used during initialization of the circuit and/or when the transition density is less than a threshold value, for example a transition density of less than one data edge per thousand bit times or symbol times. The threshold transition density value may vary with system voltage and temperature. The approach illustrated in FIG. 6A or 6B may be used during recalibration of the secondary clock signals and/or when the transition density is greater than the threshold value. In other embodiments, the two approaches may be used simultaneously.

In some embodiments, the embodiments shown in FIGS. 6A and/or 6B 600 may include fewer or additional components, logical positions of one or more components may be changed, and two or more of the components may be combined and/or shared.

There are a variety of coupling configurations that may be used during initialization and calibration of the secondary clock signals. Tables I, II and III-XI illustrate examples of embodiments of coupling configurations during initialization and normal operation for the device 310 shown in FIG. 3. Tables I and II show a first and second coupling configuration that may be used during initialization. Tables III-XI show a sequence of coupling configurations that may be used during corresponding time intervals after the initialization.

TABLE I

An embodiment of a first coupling configuration during initialization of a circuit.

| Phase Mixer | Configuration |
|---|---|
| 0 | Receiver 0 |
| 1 | Receiver 1 |
| 2 | Receiver 2 |
| 3 | Receiver 3 |
| 4 | Receiver 4 |
| 5 | Receiver 5 |
| 6 | Receiver 6 |
| 7 | Receiver 7 |

TABLE II

An embodiment of a second coupling configuration that is used after the first coupling configuration during initialization of a circuit.

| Phase Mixer | Configuration |
|---|---|
| 1 | Receiver 0 |
| 2 | Receiver 1 |
| 3 | Receiver 2 |
| 4 | Receiver 3 |
| 5 | Receiver 4 |
| 6 | Receiver 5 |
| 7 | Receiver 6 |
| 8 | Receiver 7 |

TABLE III

An embodiment of a coupling configuration in a first time interval.

| Phase Mixer | Configuration |
|---|---|
| 1 | Receiver 0 |
| 2 | Receiver 1 |
| 3 | Receiver 2 |
| 4 | Receiver 3 |

TABLE III-continued

An embodiment of a coupling configuration in a first time interval.

| Phase Mixer | Configuration |
|---|---|
| 5 | Receiver 4 |
| 6 | Receiver 5 |
| 7 | Receiver 6 |
| 8 | Receiver 7 |
| 0 | Calibration Logic |

TABLE IV

An embodiment of a coupling configuration in a second time interval.

| Phase Mixer | Configuration |
|---|---|
| 0 | Receiver 0 |
| 2 | Receiver 1 |
| 3 | Receiver 2 |
| 4 | Receiver 3 |
| 5 | Receiver 4 |
| 6 | Receiver 5 |
| 7 | Receiver 6 |
| 8 | Receiver 7 |
| 1 | Calibration Logic |

TABLE V

An embodiment of a coupling configuration in a third time interval.

| Phase Mixer | Configuration |
|---|---|
| 0 | Receiver 0 |
| 1 | Receiver 1 |
| 3 | Receiver 2 |
| 4 | Receiver 3 |
| 5 | Receiver 4 |
| 6 | Receiver 5 |
| 7 | Receiver 6 |
| 8 | Receiver 7 |
| 2 | Calibration Logic |

TABLE VI

An embodiment of a coupling configuration in a fourth time interval.

| Phase Mixer | Configuration |
|---|---|
| 0 | Receiver 0 |
| 1 | Receiver 1 |
| 2 | Receiver 2 |
| 4 | Receiver 3 |
| 5 | Receiver 4 |
| 6 | Receiver 5 |
| 7 | Receiver 6 |
| 8 | Receiver 7 |
| 3 | Calibration Logic |

TABLE VII

An embodiment of a coupling configuration in a fifth time interval.

| Phase Mixer | Configuration |
|---|---|
| 0 | Receiver 0 |
| 1 | Receiver 1 |
| 2 | Receiver 2 |
| 3 | Receiver 3 |
| 5 | Receiver 4 |
| 6 | Receiver 5 |
| 7 | Receiver 6 |

TABLE VII-continued

An embodiment of a coupling configuration in a fifth time interval.

| Phase Mixer | Configuration |
|---|---|
| 8 | Receiver 7 |
| 4 | Calibration Logic |

TABLE VIII

An embodiment of a coupling configuration in a sixth time interval.

| Phase Mixer | Configuration |
|---|---|
| 0 | Receiver 0 |
| 1 | Receiver 1 |
| 2 | Receiver 2 |
| 3 | Receiver 3 |
| 4 | Receiver 4 |
| 6 | Receiver 5 |
| 7 | Receiver 6 |
| 8 | Receiver 7 |
| 5 | Calibration Logic |

TABLE IX

An embodiment of a coupling configuration in a seventh time interval.

| Phase Mixer | Configuration |
|---|---|
| 0 | Receiver 0 |
| 1 | Receiver 1 |
| 2 | Receiver 2 |
| 3 | Receiver 3 |
| 4 | Receiver 4 |
| 5 | Receiver 5 |
| 7 | Receiver 6 |
| 8 | Receiver 7 |
| 6 | Calibration Logic |

TABLE X

An embodiment of a coupling configuration in a eighth time interval.

| Phase Mixer | Configuration |
|---|---|
| 0 | Receiver 0 |
| 1 | Receiver 1 |
| 2 | Receiver 2 |
| 3 | Receiver 3 |
| 4 | Receiver 4 |
| 5 | Receiver 5 |
| 6 | Receiver 6 |
| 8 | Receiver 7 |
| 7 | Calibration Logic |

TABLE XI

An embodiment of a coupling configuration in a ninth time interval.

| Phase Mixer | Configuration |
|---|---|
| 0 | Receiver 0 |
| 1 | Receiver 1 |
| 2 | Receiver 2 |
| 3 | Receiver 3 |
| 4 | Receiver 4 |
| 5 | Receiver 5 |
| 6 | Receiver 6 |
| 7 | Receiver 7 |
| 8 | Calibration Logic |

Figure 7:
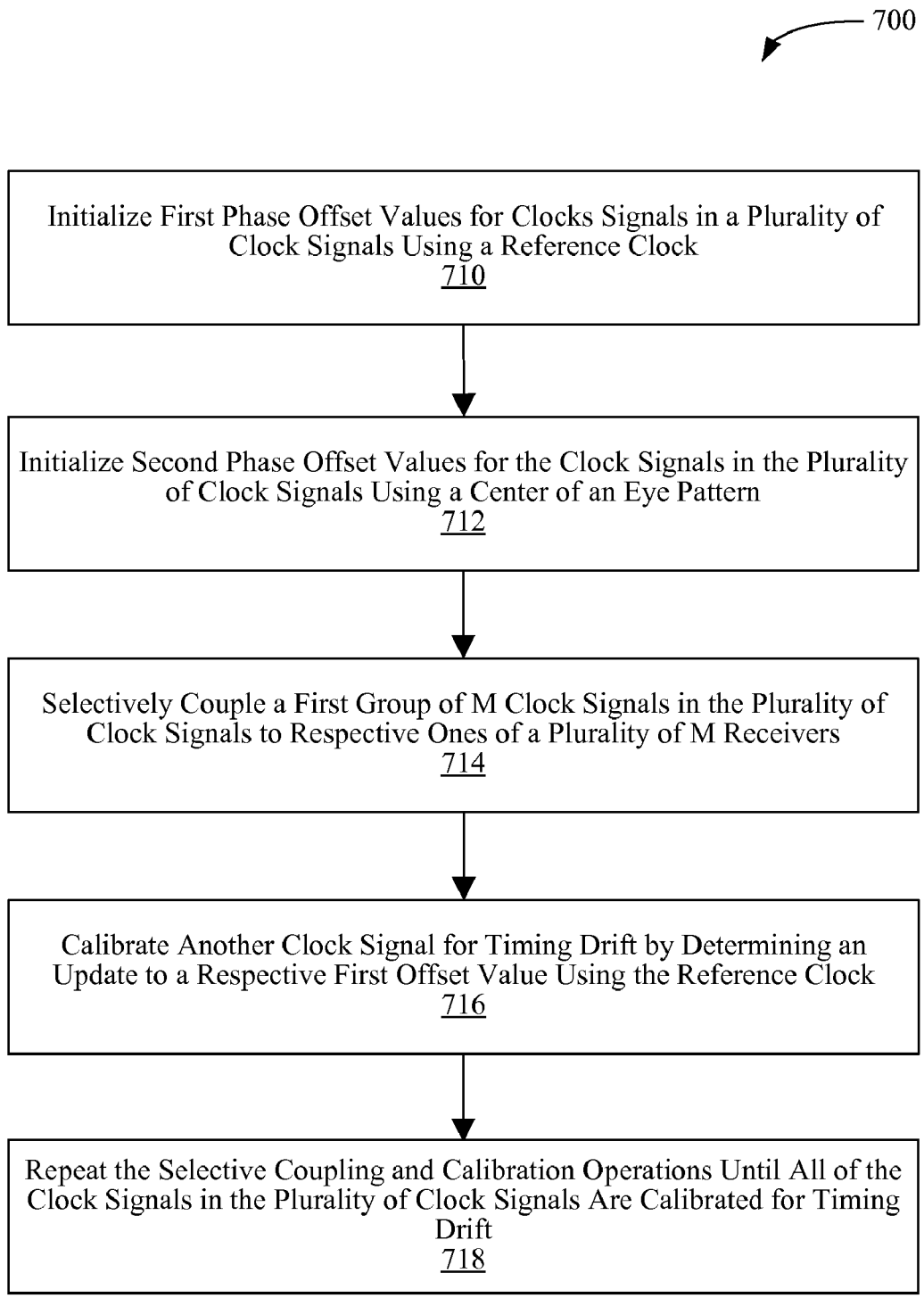
FIG. 7 is a flow diagram illustrating an embodiment of a method of timing drift cancellation.

Attention is now directed towards processes for reducing and/or eliminating timing drift. FIG. 7 is a flow diagram illustrating an embodiment of a method 700 of timing drift cancellation. This method 700 may correspond to embodiment 500 (FIG. 5). First phase offset values for clock signals in a plurality of clock signals are initialized using a reference clock (710). Second phase offset values for the clock signals in the plurality of clock signals are initialized using received data signals. In some embodiments, the received data signals are used to form or simulate an eye diagram and the phase offset values are initialized with respect to the center of the eye pattern (712). Operations 710 and 712 are used to set initial values for the timing or phase offsets stored in the phase mixer offset registers (see FIG. 4). A group of M clock signals in the plurality of clock signals are coupled to respective ones of M receivers (714). Another clock signal in the plurality of clock signals (i.e., a clock signal that is not in the group of M clock signals) is calibrated for timing drift by determining an update to a respective first offset value using the reference clock (716). The selective coupling and calibration operations are repeated during a time interval until all of the clock signals in the plurality of clock signals are calibrated for timing drift (718). In some embodiments, there may be fewer or additional operations, an order of the operations may be rearranged and/or two or more operations may be combined. In embodiments in which a respective clock signal is selectively coupled to a plurality of distinct respective receivers (one at a time) at different times, distinct offsets are determined for the respective clock signal for each receiver to which it may be coupled.

Figure 8:
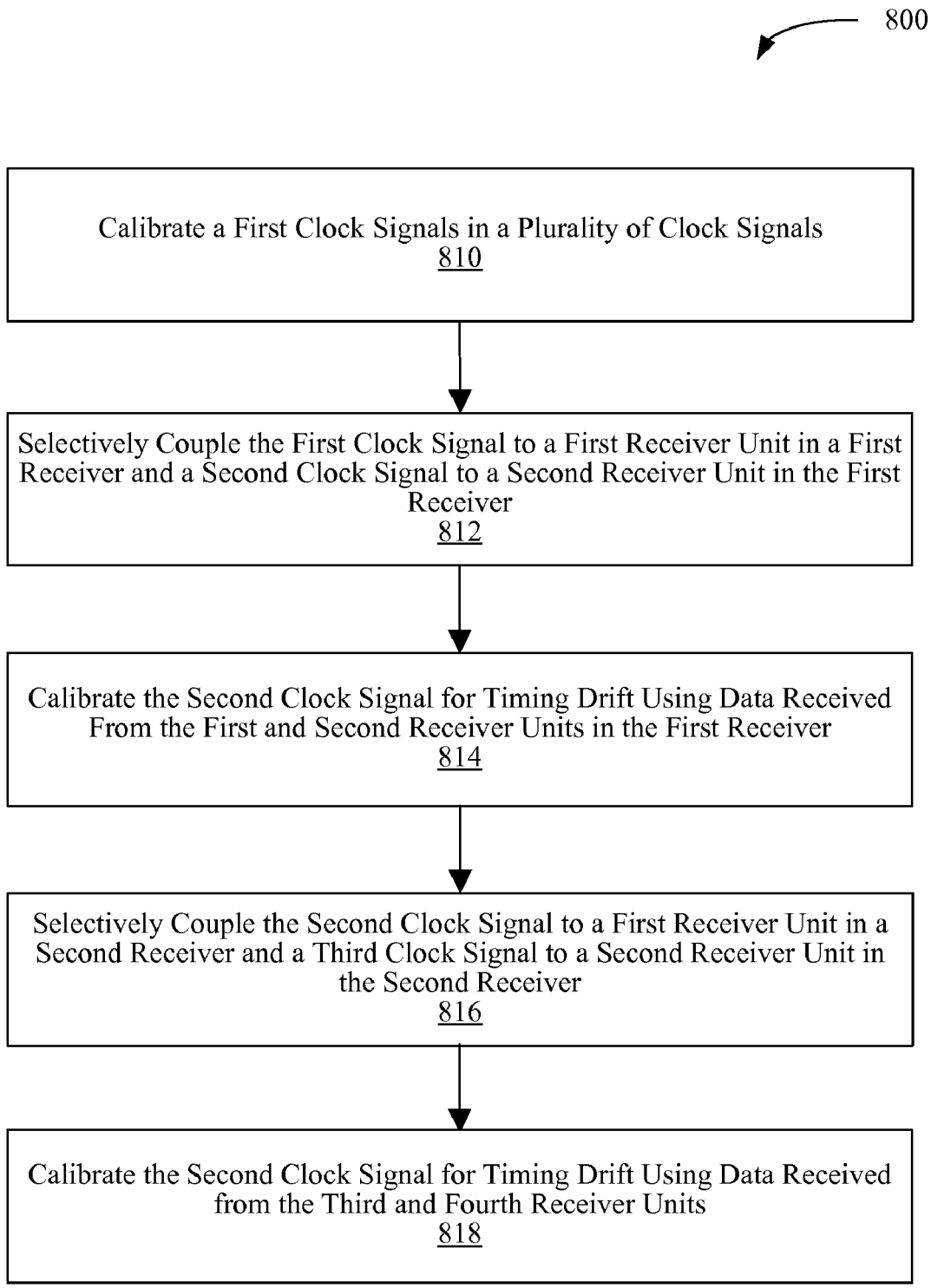
FIG. 8 is a flow diagram illustrating an embodiment of a method of timing drift cancellation.

FIG. 8 is a flow diagram illustrating an embodiment of a method 800 of timing drift cancellation. This method 800 may correspond to the receiver embodiments shown in FIG. 6A and/or FIG. 6B. A first clock signal in a plurality of clock signals us calibrated for timing drift (810). A first clock signal is selectively coupled to a first receiver unit in a first receiver and a second clock signal is selectively coupled to a second receiver unit in the first receiver (812). A timing drift in the second clock signal may be calibrated using data received from the first and second receiver units in the first receiver (814). The second clock signal is selectively coupled to a first receiver unit in a second receiver and a third clock signal is selectively coupled to a second receiver unit in the second receiver (816). For example, the first receiver may be the receiver 622 in FIG. 6A or the receiver 662 in FIG. 6B, and the second receiver may be the receiver for bit or symbol j+1 in FIG. 6A or 6B. A timing drift in the third clock signal may be calibrated using data received from the first and second receiver units in the second receiver (818). In some embodiments, there may be fewer or additional operations, an order of the operations may be rearranged and/or two or more operations may be combined.

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 9:
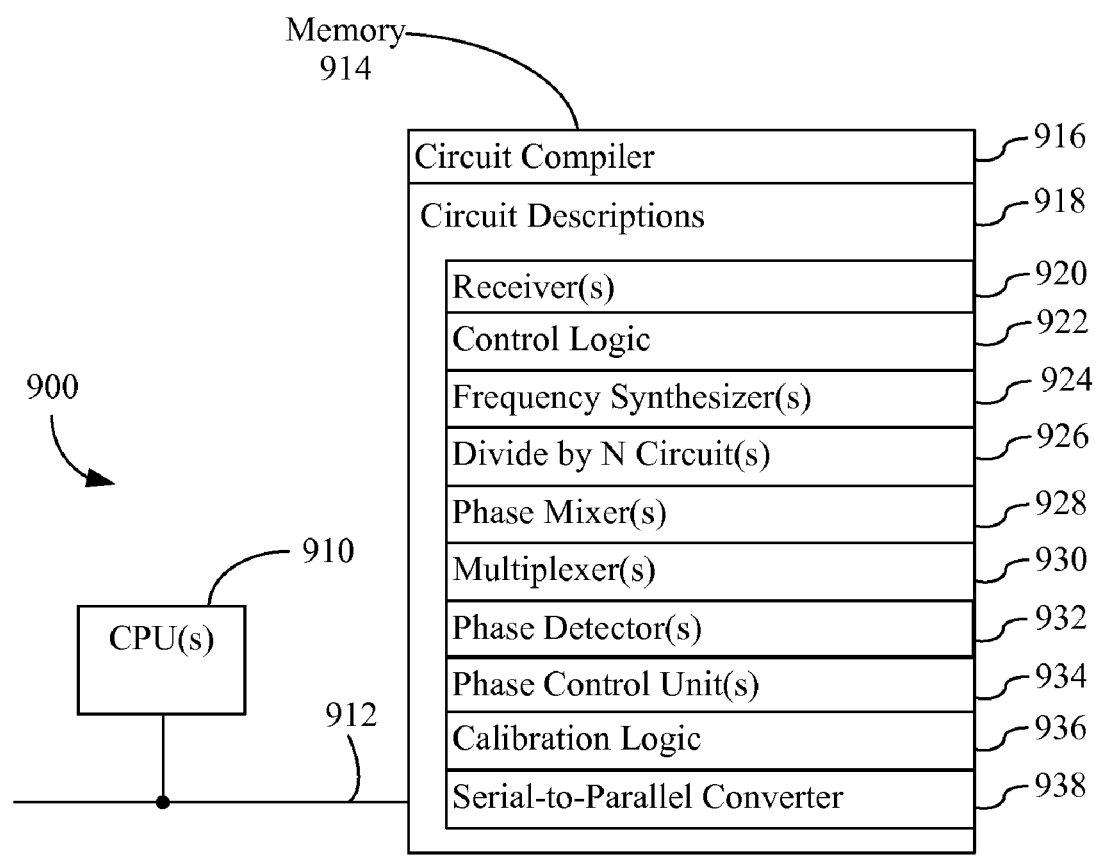
FIG. 9 is a block diagram illustrating an embodiment of a system.

FIG. 9 is a block diagram illustrating an embodiment of a system 900 for storing computer readable files containing software descriptions of the circuits. The system 900 may include at least one data processor or central processing unit (CPU) 910, memory 914 and one or more signal lines or communication busses 912 for coupling these components to one another. Memory 914 may include high-speed random access memory and/or non-volatile memory, such as one or more magnetic disk storage devices. Memory 914 may store a circuit compiler 916 and circuit descriptions 918. Circuit descriptions 918 may include circuit descriptions for the circuits, or a subset of the circuits discussed above with respect to FIGS. 3-5. In particular, circuit descriptions 918 may include circuit descriptions of one or more receivers 920, one or more control logic circuits 922, one or more frequency synthesizers 924, one or more divide-by-N circuits 926, one or more phase mixers 928, one or more multiplexers 930, one or more phase detectors 932, one or more phase control units 934, calibration logic 936, and one or more serial-to-parallel converters 938.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A receiver, comprising:
first and second receiver units, each of which includes at least one receiver circuit, wherein one of the receiver units is to output data of the receiver and the other of the receiver units is to output test data of the receiver,
first and second multiplexers to each receive two separate clock signals, wherein one of the two clock signals is selectively coupled using the first multiplexer to the first receiver unit and the other one the two clock signals is selectively coupled using the second multiplexer to the second receiver unit, and
calibration logic to compare the output data and output test data from the receiver units for calibrating one of the two separate clock signals.

2. The receiver of claim 1, including first and second serial-to-parallel converters configured to receive respective data output by the first and second receiver units, respectively, and to convert the received respective data from serial to parallel format; wherein respective data output by the first and second serial-to-parallel converters are coupled to the calibration logic, and the calibration logic is configured to compare the data from the first and second serial-to-parallel converters for calibrating one of the clock signals.

3. The receiver of claim 1, wherein the first and second receiver units are multi-bit or multi-symbol receivers that receive signals representing more than one bit per sample time.

4. The receiver of claim 1, wherein the first and second receiver units are single-bit or single-symbol receivers that receive signals representing a single bit or symbol per sample time.

5. The receiver of claim 1, wherein the receiver is for receiving a respective Jth data stream, and each of the two clock signals is coupled to a respective other receiver for receiving a different respective data stream.

6. The receiver of claim 5, wherein one of the two separate clock signals is coupled to a receiver for receiving a J−1th data stream, and the other one of the two separate clock signals is coupled to a receiver for receiving a J+1th data stream.

7. The receiver of claim 1, wherein the comparison in the calibration logic includes an XOR operation.

8. The receiver of claim 1, wherein a voltage offset of the at least one receiver circuit in the respective receiver unit is calibrated by comparing data output by the respective receiver unit with other data output by the other receiver unit.

9. The receiver of claim 1, wherein the two separate clock signals are generated by first and second distinct phase mixers and an output of the calibration logic is to update a calibration of one of the first and second phase mixers.

10. A method of calibrating clock signals for timing drift, comprising:
    selectively coupling one of two separate clock signals, using a first multiplexer, to a first receiver unit;
    selectively coupling the other one of two separate clock signals, using a second multiplexer, to a second receiver unit;
    receiving first data produced by the first receiver unit, which includes at least one respective receiver circuit;
    receiving second data produced by the second receiver unit in the same receiver, which includes at least one respective receiver circuit;
    comparing the received first data with the received second data; and
    providing updates for calibrating one of the two separate clock signals based at least in part on the comparison of the received first and second data.

11. The method of claim 10, receiving respective data output by the first and second receiver units, respectively, and converting the received respective data from serial to parallel format using first and second serial-to-parallel converters; wherein respective data output by the first and second serial-to-parallel converters are coupled to calibration logic, and the calibration logic compares the data from the first and second serial-to-parallel converters for calibrating one of the two clock signals.

12. The method of claim 10, wherein the first and second receiver units are multi-bit or multi-symbol receivers that receive signals representing more than one bit per sample time.

13. The method of claim 10, wherein the first and second receiver units are single-bit or single-symbol receivers that receive signals representing a single bit or symbol per sample time.

14. The method of claim 10, wherein the receiver is for receiving a respective Jth data stream, and each of the two separate clock signals is coupled to a respective receiver for receiving a different respective data stream.

15. The method of claim 14, wherein one of the two separate clock signals is coupled to a receiver for receiving a J−1th data stream, and the other one of the two separate clock signals is coupled to a receiver for receiving a J+1th data stream.

16. The method of claim 10, wherein the comparing includes performing an XOR operation.

17. The method of claim 10, wherein a voltage offset of a respective receiver circuit in a respective receiver unit is calibrated by comparing the data produced by the respective receiver circuit with the other data produced by the other receiver unit.

18. The method of claim 10, wherein the two separate clock signals are generated by first and second distinct phase mixers and an output produced by the comparing is to update a calibration of one of the first and second phase mixers.

19. A receiver, comprising:
    means for selectively coupling one of two separate clock signals to a first receiver;
    means for selectively coupling the other one of two separate clock signals to a second receiver;
    means for receiving first data produced by the first receiver;
    means for receiving second data produced by the second receiver;
    means for comparing the received first data with the received second data; and
    means for providing updates for calibrating one of the two separate clock signals based at least in part on the comparison of the received first and second data.

* * * * *